United States Patent
Zhang et al.

(10) Patent No.: US 10,580,626 B2
(45) Date of Patent: Mar. 3, 2020

(54) ARCING DETECTION APPARATUS FOR PLASMA PROCESSING

(71) Applicant: Applied Materials, Inc., Santa Clara, CA (US)

(72) Inventors: Lin Zhang, San Jose, CA (US); Rongping Wang, Cupertino, CA (US); Jian J. Chen, Fremont, CA (US); Michael S. Cox, Gilroy, CA (US); Andrew V. Le, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 320 days.

(21) Appl. No.: 15/348,579

(22) Filed: Nov. 10, 2016

(65) Prior Publication Data

US 2017/0162370 A1 Jun. 8, 2017

Related U.S. Application Data

(60) Provisional application No. 62/263,472, filed on Dec. 4, 2015.

(51) Int. Cl.
*G01R 31/00* (2006.01)
*G01R 31/14* (2006.01)
(Continued)

(52) U.S. Cl.
CPC .. *H01J 37/32944* (2013.01); *H01J 37/32082* (2013.01); *H01J 37/32715* (2013.01)

(58) Field of Classification Search
CPC ......... H01J 37/32; G01R 31/00; G01R 31/14; G06F 19/00; G08B 21/00; G01J 3/46; G01N 27/00
See application file for complete search history.

(56) References Cited

U.S. PATENT DOCUMENTS 6,894,474 B2 * 5/2005 Cox ............... H01J 37/32935
324/71.1
8,581,597 B2 * 11/2013 Coumou ............ G01R 19/0061
324/536
(Continued)

FOREIGN PATENT DOCUMENTS

KR   20080006750 A   1/2008
KR   20120127350 A   11/2012
(Continued)

OTHER PUBLICATIONS

International Search Report and Written Opinion from PCT/US2016/060240 dated Mar. 13, 2017.

Primary Examiner — Neel D Shah
(74) Attorney, Agent, or Firm — Patterson + Sheridan LLP

(57) ABSTRACT

Embodiments described herein generally relate to a plasma processing chamber and a detection apparatus for arcing events. In one embodiment, an arcing detection apparatus is disclosed herein. The arcing detection apparatus comprises a probe, a detection circuit, and a data log system. The probe positioned partially exposed to an interior volume of a plasma processing chamber. The detection circuit is configured to receive an analog signal from the probe and output an output signal scaling events present in the analog signal. The data log system is communicatively coupled to receive the output signal from the detection circuit. The data log system is configured to track arcing events occurring in the interior volume.

14 Claims, 3 Drawing Sheets

(51) Int. Cl.
*G06F 19/00* (2018.01)
*G08B 21/00* (2006.01)
*G01N 27/00* (2006.01)
*H01J 37/32* (2006.01)

(56) References Cited

U.S. PATENT DOCUMENTS

| | | | |
|---|---|---|---|
| 9,594,107 B1* | 3/2017 | Lawton | G01R 31/045 |
| 2008/0122369 A1* | 5/2008 | Nitschke | H01J 37/32935 |
| | | | 315/111.21 |
| 2009/0160417 A1* | 6/2009 | Klimczak | H01J 37/3444 |
| | | | 323/305 |
| 2009/0308734 A1* | 12/2009 | Krauss | H01J 37/32935 |
| | | | 204/192.13 |
| 2011/0011730 A1* | 1/2011 | Valcore, Jr. | H01J 37/32091 |
| | | | 204/192.1 |
| 2011/0040508 A1* | 2/2011 | Lee | G01J 3/02 |
| | | | 702/66 |
| 2012/0075108 A1* | 3/2012 | Chen | H01J 37/32183 |
| | | | 340/661 |
| 2013/0073241 A1 | 3/2013 | Coumou | |
| 2015/0048862 A1* | 2/2015 | Na | G01R 31/12 |
| | | | 324/762.05 |

FOREIGN PATENT DOCUMENTS

| | | |
|---|---|---|
| TW | 200935984 A | 8/2009 |
| TW | 201011118 A | 3/2010 |

\* cited by examiner

ARCING DETECTION APPARATUS FOR PLASMA PROCESSING

CROSS-REFERENCE TO RELATED APPLICATIONS

This application claims priority from U.S. Provisional Application Ser. No. 62/263,472 filed Dec. 4, 2015, which is hereby incorporated by reference in its entirety.

BACKGROUND

Field

Embodiments described herein relate to arcing detection in plasma processing chambers, and more specifically to an arcing detection apparatus and method for detecting arcing in a plasma processing chamber.

Description of the Related Art

Arcing issues may exist in almost all plasma environments within semiconductor processing equipment due to a high voltage difference between two closely spaced points in the plasma processing chamber. The arcing may cause ablation of underlying materials, substrate breakage, and/or damage to the processing chamber.

Failure to detect arcing events during substrate processing leads to batches of unusable or low yield semiconductor substrates, which, in turn, may lead to the loss of potentially thousands of dollars in revenue.

Therefore, there is a need for devices and methods for improved arcing detection in plasma processing chambers.

SUMMARY

Embodiments described herein generally relate to a plasma processing chamber and a detection apparatus for arcing events. In one embodiment, an arcing detection apparatus is disclosed herein. The arcing detection apparatus comprises a probe, a detection circuit, and a data log system. The probe partially exposed to an interior volume of a plasma processing chamber. The detection circuit is configured to receive an analog signal from the probe and output an output signal scaling events present in the analog signal. The data log system is communicatively coupled to receive the output signal from the detection circuit. The data log system is configured to track arcing events occurring in the interior volume.

In another embodiment, a plasma processing chamber is disclosed herein. The plasma processing chamber comprises a chamber body, a pedestal assembly, a showerhead, and an arcing detection apparatus. The chamber body defines an interior volume. The pedestal assembly is disposed in the interior volume. The pedestal assembly is configured to support a substrate. The showerhead is disposed in the interior volume above the pedestal assembly. The showerhead is configured to generate a plasma in the interior volume. The arcing detection apparatus comprises a probe, a detection circuit, and a data log system. The probe partially exposed to an interior volume of a plasma processing chamber. The detection circuit is configured to receive an analog signal from the probe and output an output signal scaling events present in the analog signal. The data log system is communicatively coupled to receive the output signal from the detection circuit. The data log system is configured to track arcing events occurring in the interior volume.

In another embodiment, a method for detecting an arcing event in a plasma processing chamber is disclosed herein. The method includes transmitting a signal from a probe positioned partially in an interior volume of the processing chamber to a detection circuit, determining whether an arcing event occurred in the interior volume, responsive to determining that an arcing event occurred, flagging the arcing event, and outputting a scaled signal to a data log system.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
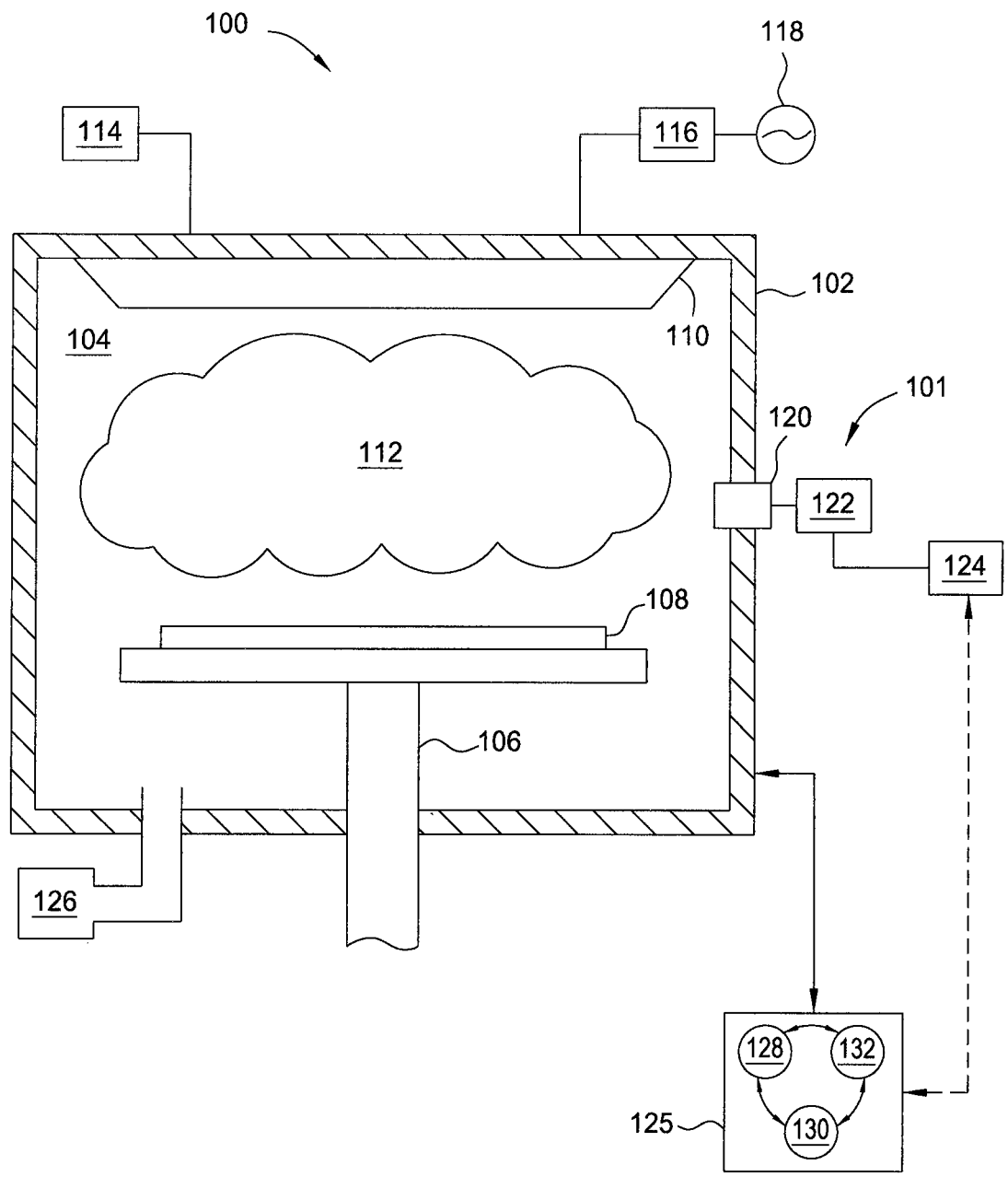
FIG. 1 illustrates a plasma processing chamber having a probe, according to one embodiment.

FIG. 1 illustrates a plasma processing chamber 100 interfaced with an arcing detection apparatus 101, according to one embodiment. The plasma processing chamber 100 includes a chamber body 102. The chamber body 102 defines an interior volume 104. A pedestal assembly 106 is disposed in the interior volume 104. The pedestal assembly 106 is configured to support a substrate 108 during processing. The chamber 100 further includes one or more gas injection ports or a showerhead 110 disposed above the pedestal assembly 106 for dispensing a process gas provided by a gas supply 114 to the interior volume 104. The showerhead 110 may function as an electrode for energizing the process gas to form a plasma 112 with an energy source 118. The electrode or coil for energizing the process gas may be disposed in alternative locations. The energy source 118 may be a radio frequency (RF) source. A matching circuit 116 may be provided between the energy source 118 and the electrode for impedance matching. A vacuum pump 126 may also be coupled to the chamber body 102 to maintain a process volume at a desired pressure.

The arcing detection apparatus 101 includes a probe 120, a data log system 124, and a detection circuit 122. The probe 120 extends partially into the interior volume 104. The probe 120 is configured to detect arcing events inside the plasma processing chamber 100 by sensing plasma fluctuations and instabilities in the interior volume 104. The probe 120 communicates with the data log system 124. The data log system 124 keeps track of the number of arcing events that occurs during plasma processing. An arcing event occurs when there is a drop in plasma potential. Some arcing events may have a duration that lasts greater than 100 microseconds. Other arcing events may have a duration that lasts less than 100 microseconds. The data log system 124 is not able to sense when an arcing event occurs in a time range less than 100 microseconds.

To cure this, the detection circuit 122 is used as a signal scaling system between the data probe 120 and the data log system 124. The detection circuit 122 scales the signal level of an analog signal provided by the probe 120 into a specific range for the data log system 124. The detection circuit 122 may also filter the analog signal from the probe 120 to remove false potential drops. The detection circuit 122 is able to separate quicker arcing events from slower arcing events. For example, the detection circuit 122 may include a processor that is able to discriminate between arcing events greater than or less than 100 microseconds. The detection circuit 122 flags the fast arcing events (less than 100 microseconds), scales a portion of the analog signal exhibiting a drop in potential to have a longer duration that is readable by the data log system, and converts the scaled analog signal to a digital signal so that the data log system 124 is able to log the occurrence of the arcing event. This allows shorter arcing events to be detected and analyzed in real-time, which can be used to flag and stop processing to prevent arcing damage to the plasma processing chamber 100.

The chamber 100 further includes a controller 125. The controller 125 may be configured to control the operation of the processing chamber 100. For example, the controller 125 may be in communication with the data log system 124 such that when an arcing event is detected, the data log system 124 can communicate the occurrence and/or other information about the event to the controller 125, and the controller 125 can determine if processing should be halted. The controller 125 includes a programmable central processing unit (CPU) 128 that is operable with a memory 130 and a mass storage device, an input control unit, and a display unit. Support circuits 132 are coupled to the CPU for supporting the processor in a conventional manner.

Figure 2:
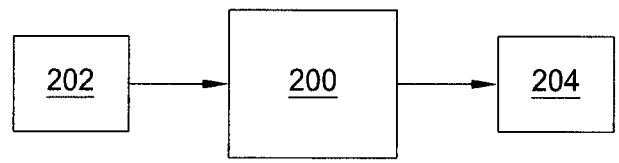
FIG. 2 illustrates a circuit design for the detection circuit used with the probe in FIG. 1, according to one embodiment.

FIG. 2 illustrates one embodiment of the detection circuit 122. The detection circuit 122 is shown as a circuit 200 having an input 202 and an output 204. The input 202 received the information provided by the probe 120, such as an analog signal indicative of the state of the plasma to the circuit 200. The circuit 200 scales the portion of the analog signal corresponding to an arcing event, such as for example a drop in potential to have a longer duration, to a form readable by the data log system 124. The form readable by the data log system 124 may be an analog output signal having arcing events represented by a signal portion having duration greater than 100 microseconds.

In one example, the circuit 200 converts the short duration spike present in the analog signal that is indicative of an arcing event to a digital signal such as a step or other indicator having a longer duration, such as longer than 100 microseconds. The circuit 200 may also convert the analog signal from the probe to a digital signal, which is provided through the output 204 to the data log system 124. In one embodiment, the circuit 200 changes a portion of the analog signal having a drop in potential with a duration less than 100 microseconds to a digital signal where the portion indicating the drop in potential on the analog signal has a duration greater than 100 microseconds. Thus, the output signal of the detection circuit 122 is a digital and scaled signal transmitted through the output 204 of the circuit 200 to the data log system 124.

Optionally, the circuit 200 may also include filter circuitry (not shown). The filter circuitry may be configured to remove portions of the analog signal provided by the probe 120 which are below a predetermined threshold. For example, filter circuitry may be configured to remove portions of the analog signal provided by the probe 120 having an amplitude below a predetermined threshold, which may be either negligible arcing or not indicative of an arcing event. Alternatively, the filtering function of the filter circuitry may be performed in a processor of one of the controller 125, detection circuit 122, data log system 124 or other processor.

Figure 4:
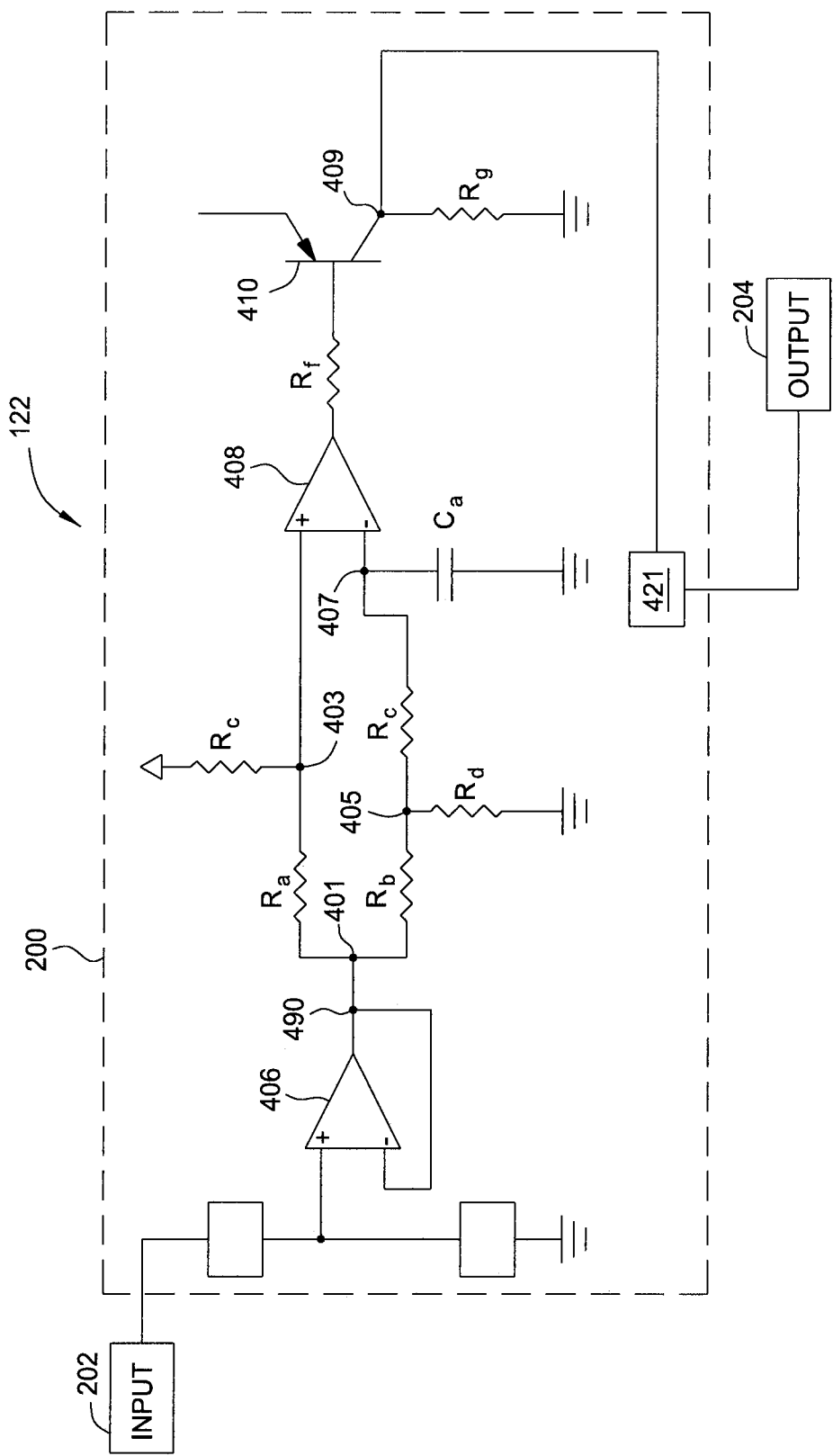
FIG. 4 illustrates another embodiment of the detection circuit, illustrating the circuit of FIG. 2 in more detail.

FIG. 4 illustrates another embodiment of the detection circuit 122, illustrating the circuit 200 in more detail. The input 202 feeds into a non-inverting input of an operational amplifier 406 of the circuit 200 (shown in phantom). An output of the operational amplifier 406 meets at node 490. Node 490 branches off to feed back into an inverting input of the operational amplifier 406 and to another node 401. Node 401 branches off to resistor $R_a$ and resistor $R_b$. Resistor $R_a$ is connected to resistor $R_c$ at node 403. Resistor $R_a$ feeds into a non-inverting input of operational amplifier 408. Resistor $R_b$ is connected to resistor $R_d$ and variable resistor $R_e$ at node 405. Variable resistor $R_e$ is connected to operational amplifier 408 through an inverting input and capacitor $C_a$ at node 407. The output of operational amplifier 408 is connected to resistor $R_f$. Resistor $R_f$ is connected to p-n-p transistor 410. The collector terminal of transistor 410 is connected to resistor $R_g$ at node 409 and monostable multivibrator 421. In one example, the monostable multivibrator 421 is monostable multivibrator 74HC123E commercially available from Texas Instruments. The monostable multivibrator 421 is connected to the output 204.

Figure 3:
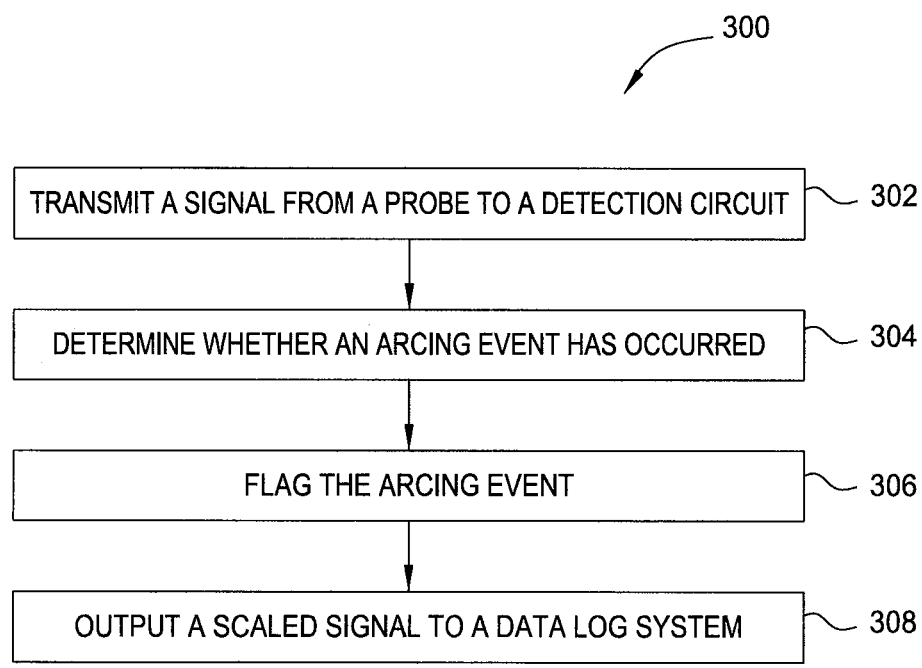
FIG. 3 illustrates a method of using the probe of FIG. 1 to detect arcing events in a plasma processing chamber, according to one embodiment.

FIG. 3 illustrates a method 300 for detecting an arcing event in a plasma processing chamber, according to one embodiment. The method begins at operation 302.

At operation 302, a probe positioned partially in the interior volume of a processing chamber sends a signal to a detection circuit. The signal sent from the probe is an analog signal. The analog signal is representative of the state of a plasma generated in the interior volume of the processing chamber.

At operation 304, the detection circuit determines if an arcing event occurs in the interior volume. An arcing event occurs when there is a drop in plasma potential. Therefore, the detection circuit looks for drops in the analog signal provided by the probe. In one embodiment, the detection circuit includes a processor to determine if there is a drop in plasma potential corresponding to an arcing event. In another embodiment, the processor may be included in the controller. In yet another embodiment, the processor may be a remote processor in communication with the detection circuit.

At operation 306, in response to determining that an arcing event has occurred, the detection circuit flags the arcing event. The detection circuit flags the arcing event by scaling the drop in potential in the analog signal to a duration readable by the data analog system. For example, the detection circuit extends the duration of the drop in plasma potential to greater than 100 microseconds. This creates a scaled analog signal. The detection circuit converts the scaled analog signal to a digital signal readable by the data analog system. The detection circuit, therefore, acts as a bridge between the probe and the data analog system by taking the analog signal that is unreadable by the data analog system and scaling it to a readable digital signal. This allows a user of the processing chamber to detect the occurrence of small arcing events before a multitude of smaller arcing events compound to larger arcing damage.

At operation 308, the detection signal outputs the digital signal to the data log system. The data log system notifies the user of the processing chamber when an arcing event has occurred. This allows the user to stop processing and tend to the arcing damage.

While the foregoing is directed to specific embodiments, other and further embodiments may be devised without departing from the basic scope thereof, and the scope thereof is determined by the claims that follow.

What is claimed is:

1. An arcing detection apparatus, comprising:
a probe positioned partially exposed to an interior volume of a plasma processing chamber;
a detection circuit configured to:
receive an analog signal from the probe, the analog signal derived from a plasma potential in the interior volume;
determine an arcing event has occurred based on detecting a first drop of the analog signal, wherein the first drop has a first duration and a first magnitude; and
output an output signal based on the detected first drop of the analog signal, wherein
the output signal has a second duration that is greater than the first duration, and
the first duration is less than 100 microseconds and the second duration is greater than 100 microseconds; and
a data log system in communication with the detection circuit, the data log system configured to detect input signals greater than 100 microseconds and to receive the output signal from the detection circuit.

2. The arcing detection apparatus of claim 1, wherein the detection circuit is operable to convert the analog signal from the probe to a digital signal.

3. The arcing detection apparatus of claim 1, wherein the detection circuit is further configured to filter the analog signal.

4. The arcing detection apparatus of claim 1, wherein the detection circuit comprises:
a first op amp and a second op amp, each op amp having a first input, a second input, and an output, wherein
the first input of the first op amp is connected to the analog signal,
the first input of the second op amp is connected to the output of the first op amp, and
the second input of the second op amp is connected to the output of the first op amp through a first resistor with a grounded capacitor connected to the second input of the second op amp between the first resistor and the second input of the second op amp.

5. The arcing detection apparatus of claim 4, wherein the detection circuit further comprises a monostable multivibrator configured to operate based on the output of the second op amp.

6. A plasma processing chamber, comprising:
a chamber body defining an interior volume;
a pedestal assembly disposed in the interior volume, the pedestal assembly configured to support a substrate;
a showerhead disposed in the interior volume, above the pedestal assembly, the showerhead configured to generate a plasma in the interior volume; and
an arcing detection apparatus, comprising:
a probe partially exposed to an interior volume of a plasma processing chamber;
a detection circuit configured to:
receive an analog signal from the probe, the analog signal derived from a plasma potential in the interior volume;
determine an arcing event has occurred based on detecting a first drop of the analog signal, wherein the first drop has a first duration and a first magnitude; and
output an output signal based on the detected first drop of the analog signal, wherein the output signal has a second duration that is greater than the first duration, and the first duration is less than 100 microseconds and the second duration is greater than 100 microseconds; and
a data log system in communication with the detection circuit, the data log system configured to detect input signals greater than 100 microseconds and to receive the output signal from the detection circuit.

7. The plasma processing chamber of claim 6, wherein the detection circuit is operable to convert the analog signal from the probe to a digital signal.

8. The plasma processing chamber of claim 6, further comprising a controller in communication with the arcing detection apparatus, the controller configured to stop a process being performed in the plasma processing chamber in response to the output of the output signal from the detection circuit.

9. The plasma processing chamber of claim 6, wherein the detection circuit is further configured to filter the analog signal.

10. The plasma processing chamber of claim 6, wherein the detection circuit comprises:
a first op amp and a second op amp, each op amp having a first input, a second input, and an output, wherein
the first input of the first op amp is connected to the analog signal,
the first input of the second op amp is connected to the output of the first op amp, and
the second input of the second op amp is connected to the output of the first op amp through a first resistor with a grounded capacitor connected to the second input of the second op amp between the first resistor and the second input of the second op amp; and
a monostable multivibrator configured to operate based on the output of the second op amp.

11. A method for detecting an arcing event in a plasma processing chamber, comprising:
transmitting an analog signal from a probe positioned partially in an interior volume of the processing chamber to a detection circuit, the analog signal derived from a plasma potential in the interior volume;
determining, by the detection circuit an arcing event occurred in the interior volume based on detecting a first drop of the analog signal, wherein the first drop has a first duration and a first magnitude;
responsive to determining that the arcing event occurred, outputting, by the detection circuit, an output signal, wherein
the output signal has a second duration that is greater than the first duration, and
the first duration is less than 100 microseconds and the second duration is greater than 100 microseconds; and
receiving, by a data loci system, the output signal from the detection circuit, wherein the data log system is configured to detect input signals greater than 100 microseconds.

12. The method of claim 11, wherein the output signal is a digital signal.

13. The method of claim 11, wherein the detection circuit filters the analog signal transmitted by the probe.

14. The method of claim 11, wherein
the detection circuit comprises a first op amp and a second op amp, each op amp having a first input, a second input, and an output,
detecting the first drop of the analog signal is detected by the second op amp of the detection circuit,
the first input of the first op amp is connected to the analog signal,
the first input of the second op amp is connected to the output of the first op amp, and
the second input of the second op amp is connected to the output of the first op amp through a first resistor with a grounded capacitor connected to the second input of the second op amp between the first resistor and the second input of the second op amp.

* * * * *